(12) United States Patent
Ding et al.

(10) Patent No.: US 7,759,243 B2
(45) Date of Patent: Jul. 20, 2010

(54) METHOD FOR FORMING AN ON-CHIP HIGH FREQUENCY ELECTRO-STATIC DISCHARGE DEVICE

(75) Inventors: Hanyi Ding, Essex Jct, VT (US); Kai D. Feng, Hopewell Jct., NY (US); Zhong-Xiang He, Essex Junction, VT (US); Xuefeng Liu, South Burlington, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 199 days.

(21) Appl. No.: 12/144,089

(22) Filed: Jun. 23, 2008

(65) Prior Publication Data
US 2009/0317970 A1   Dec. 24, 2009

(51) Int. Cl.
    *H01L 21/00* (2006.01)
(52) U.S. Cl. .................. 438/622; 438/619; 438/638; 257/E21.575
(58) Field of Classification Search .......... 438/619, 438/622, 637, 638, 640; 257/E21.573, E21.575
    See application file for complete search history.

(56) References Cited

U.S. PATENT DOCUMENTS

| | | | |
|---|---|---|---|
| 4,531,176 A | 7/1985 | Beecher, II | |
| 5,697,799 A | 12/1997 | Consoli et al. | |
| 5,990,519 A | 11/1999 | Huang-Lu et al. | |
| 6,121,954 A | 9/2000 | Seffernick | |
| 6,204,549 B1 | 3/2001 | Igel et al. | |
| 6,406,948 B1 * | 6/2002 | Jun et al. | 438/152 |
| 6,515,488 B1 | 2/2003 | Thomas | |
| 6,661,576 B2 | 12/2003 | Pinto | |
| 6,826,828 B1 | 12/2004 | Shen | |
| 6,916,188 B2 | 7/2005 | Lang et al. | |
| 7,196,406 B2 | 3/2007 | Kuzmenka | |
| 7,256,976 B2 | 8/2007 | Sato | |
| 7,295,590 B2 | 11/2007 | Crews | |
| 7,535,105 B2 | 5/2009 | Voldman | |
| 2009/0091233 A1 | 4/2009 | Te-Pang | |

OTHER PUBLICATIONS

Ding et al., U.S. Appl. No. 12/144,084, filed Jun. 23, 2008, 11 pages.

* cited by examiner

*Primary Examiner*—Thanhha Pham
(74) *Attorney, Agent, or Firm*—Anthony Canale; Hoffman Warnick LLC

(57) ABSTRACT

A method for forming an on-chip high frequency electro-static discharge device on an integrated circuit is described. In one embodiment of the method, a capped first dielectric layer with more than one electrode formed therein is provided. A second dielectric layer is deposited over the capped first dielectric layer. A first hard mask dielectric layer is deposited over the second dielectric layer. A cavity trench is formed through the first hard mask dielectric layer and the second dielectric layer to the first dielectric layer, wherein the cavity trench is formed in the first dielectric layer between two adjacent electrodes. At least one via is formed through the second dielectric layer about the cavity trench. A metal trench is formed around each of the at least one via. A release opening is formed over the cavity trench. A third dielectric layer is deposited over the second dielectric layer, wherein the third dielectric layer hermetically seals the release opening to provide electro-static discharge protection.

20 Claims, 18 Drawing Sheets

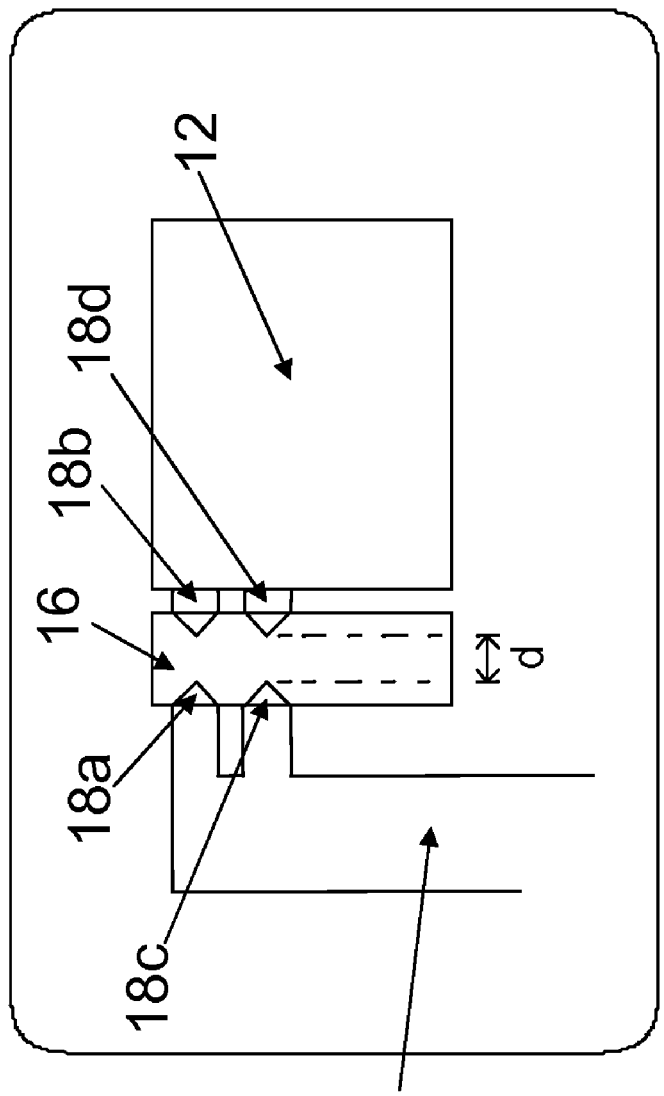

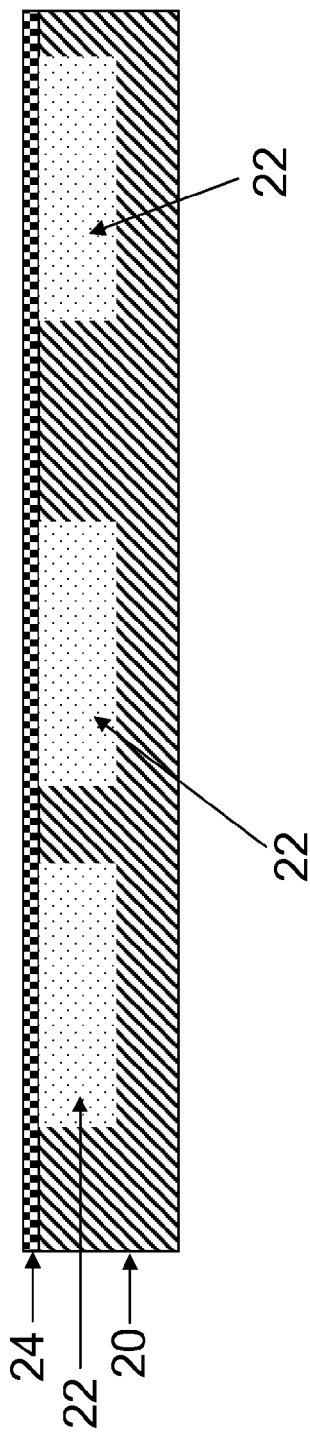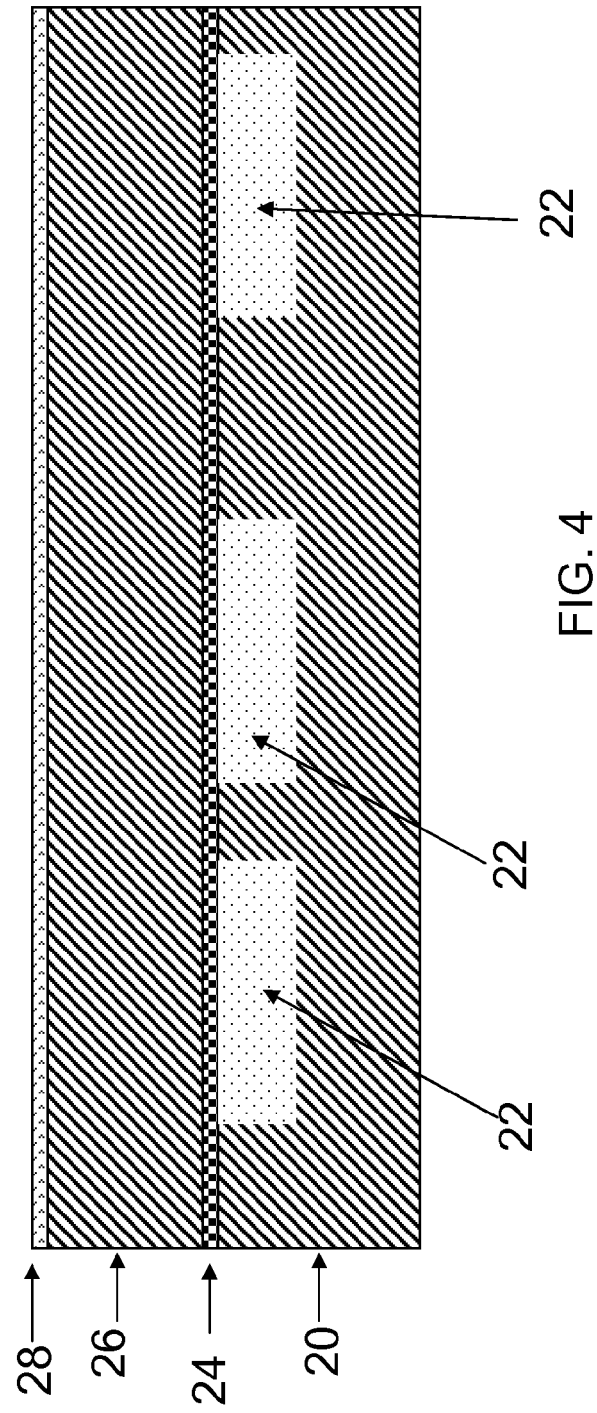

METHOD FOR FORMING AN ON-CHIP HIGH FREQUENCY ELECTRO-STATIC DISCHARGE DEVICE

CROSS REFERENCE TO RELATED APPLICATIONS

This patent application relates to commonly-assigned U.S. patent application Ser. No. 12/144,095 entitled "DESIGN STRUCTURE FOR AN ON-CHIP HIGH FREQUENCY ELECTRO-STATIC DISCHARGE DEVICE", Ser. No. 12/144,071 entitled "METHOD FOR FORMING AN ON-CHIP HIGH FREQUENCY ELECTRO-STATIC DISCHARGE DEVICE", and Ser. No. 12/144,094 entitled "DESIGN STRUCTURE FOR AN ON-CHIP HIGH FREQUENCY ELECTRO-STATIC DISCHARGE DEVICE", all filed concurrently with this application.

FIELD OF THE INVENTION

This disclosure relates generally to integrated circuit design, and more specifically to a method for forming an on-chip high frequency electro-static discharge device.

BACKGROUND

As electronic components get smaller and smaller along with the internal structures in integrated circuits, it is becoming easier to either completely destroy or otherwise impair electronic components. In particular, many integrated circuits are highly susceptible to damage from the discharge of static electricity. Electro-static discharge (ESD) is the transfer of an electro-static charge between bodies at different electro-static potentials (voltages), caused by direct contact or induced by an electro-static field. The discharge of static electricity, or ESD, has become a critical problem for the electronics industry.

Device failures that result from ESD events are not always immediately catastrophic or apparent. Often, the device is only slightly weakened but is less able to withstand normal operating stresses and hence, may result in a reliability problem. Therefore, various ESD protection circuits must be included in the device to protect the various components.

Typical ESD protection circuits use an on-chip diode based ESD protection. These on-chip diode ESD devices work well for lower frequency currents but at higher frequency circuits such as millimeter wave circuits, these ESD protection circuits severely impair the performance of the millimeter wave circuits because of its inability to ameliorate the large parasitic capacitance that arises during the high operating frequency.

One approach that has been contemplated for overcoming the problems associated with using an on-chip diode ESD device for millimeter wave circuits is to use a matching circuit for ESD protection. However, the use of a matching circuit for ESD protection is a high risk solution because almost all matching circuits comprise inductances. Problems can arise when a high ESD current flows through the circuit. In particular, when a high ESD current flows through the circuit, the inductance generates high voltage which can damage input and output circuits.

SUMMARY

In one embodiment, there is a method for forming an electro-static discharge protection device on an integrated circuit. In this embodiment, a capped first dielectric layer with more than one electrode formed therein is provided. A second dielectric layer is deposited over the capped first dielectric layer. A first hard mask dielectric layer is deposited over the second dielectric layer. A cavity trench is formed through the first hard mask dielectric layer and the second dielectric layer to the first dielectric layer, wherein the cavity trench is formed in the first dielectric layer between two adjacent electrodes. At least one via is formed through the second dielectric layer about the cavity trench. A metal trench is formed around each of the at least one via. A release opening is formed over the filled cavity trench. A third dielectric layer is deposited over the second dielectric layer, wherein the third dielectric layer hermetically seals the release opening to provide electro-static discharge protection.

In a second embodiment, there is a method for forming an electro-static discharge protection device on an integrated circuit. In this embodiment, a capped first dielectric layer with more than one electrode formed therein is provided. A second dielectric layer is deposited over the capped first dielectric layer. A first hard mask dielectric layer is deposited over the second dielectric layer. A cavity trench is formed through the first hard mask dielectric layer and the second dielectric layer to the first dielectric layer, wherein the cavity trench is formed in the first dielectric layer between two adjacent electrodes. The cavity trench is filled with a sacrificial material. At least one via is formed through the second dielectric layer about the cavity trench. A metal trench is formed around each of the at least one via. A release opening is formed over the filled cavity trench. The sacrificial film inside the cavity trench is removed. A third dielectric layer is deposited over the second dielectric layer, wherein the third dielectric layer hermetically seals the release opening to provide electro-static discharge protection.

BRIEF DESCRIPTION OF THE DRAWINGS

FIG. 2 shows a top-down view of an electro-static discharge device according to a second embodiment of the disclosure; and FIGS. 3-19 show the general process flow of forming the electro-static discharge devices depicted in FIGS. 1 and 2 according to one embodiment of this disclosure.

DETAILED DESCRIPTION

Figure 1:
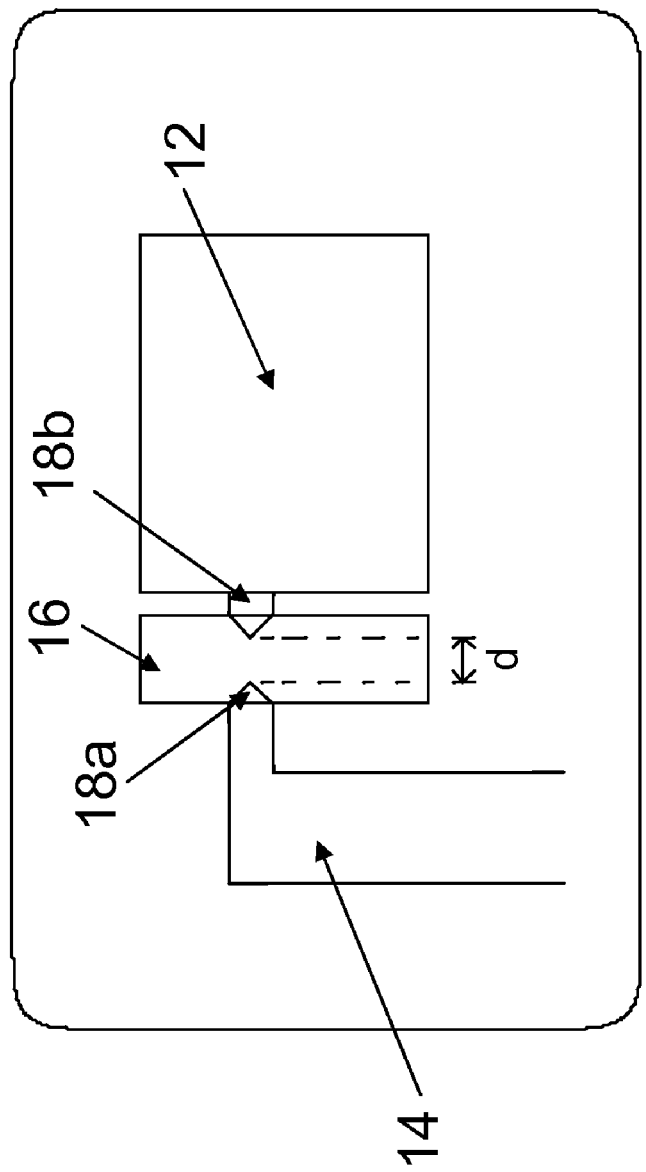
FIG. 1 shows a top-down view of an electro-static discharge device according to one embodiment of the disclosure.

FIG. 1 shows a top-down view of an electro-static discharge (ESD) device 10 according to one embodiment of the disclosure. As shown in FIG. 1, the ESD device 10 comprises a pad 12 which connects to components of a circuit such as a high frequency (e.g., a millimeter wave) circuit (not shown). A metal wire 14, separated by a gap 16, is adjacent to the pad 12. The metal wire 14 is a wire in the high frequency circuit (not shown) that is grounded by a substrate in the circuit (not shown). The gap 16 can be a vacuum gap or an air gap. Tips 18*a* and 18*b* protrude from the pad 12 and the metal wire 14, respectively, into the gap 16. Tips 18*a* and 18*b* can be made of copper, aluminum, tungsten or the like. As shown in FIG. 1, tips 18*a* and 18*b* have sharp tips and are separated from each other in the gap 16 by a distance denoted by d. Because the size of tips 18*a* and 18*b* can be designed to be as small as the minimum metal line width defined by a design rule, the parasitic capacitance can be ignored. Those skilled in the art will recognize that tips 18*a* and 18*b* can take on different shapes and that the distance d can vary depending on the amount of protection desired to ameliorate high voltage events (i.e., the distance d determines the ESD clamping voltage).

An ESD event (e.g., a high voltage) will enter the device 10 through the pad 12 (the pad is connected to the outside world) towards tips 18a and 18b. When the voltage applied to tips 18a and 18b exceeds the clamping voltage, a discharge occurs in the tips through the air gap such that the high voltage event is grounded through the metal wire 14 to the substrate. During the discharge, resistance is very low which keeps the voltage between the tips very low so that the underlying circuit can be protected. When the voltage is lower than the clamping voltage, then the discharge is over and tips 18a and 18b are resumed isolated.

Those skilled in the art will recognize that the ESD device 10 shown in FIG. 1 is only one possible embodiment of implementing this concept and that other implementations are possible. For example, FIG. 2 shows a top-down view of an ESD device 19 according to a second embodiment of the disclosure. In particular, the ESD device 19 includes multiple tips 18a, 18b, 18c, and 18d. The ESD device 19 operates in a manner similar to the ESD device 10, except that multiple tips are used to discharge high voltage events. Although four tips are shown in FIG. 2, those skilled in the art will recognize that this only illustrative and that any reasonable number of tips can be used.

FIGS. 3-19 show the general process flow of forming an ESD according to one embodiment of this disclosure. In particular, FIGS. 3-19 generally pertain to a process of forming ESD device 10 depicted in FIG. 1, however, the description is suitable for fabricating ESD device 19. Those skilled in the art will recognize that forming ESD device 19 will require additional steps to produce the extra tips.

The process starts at FIG. 3 with an incoming wafer having metal wiring. As shown in FIG. 3, the incoming wafer includes an inter-level dielectric (ILD) layer 20 having more than one electrode 22 formed therein and a capping layer 24 deposited on the ILD layer. The ILD layer 20 is any suitable dielectric film that may include organosilicate glass (SiCOH), fluoride silicate glass (FSG) or undoped silicate glass (USG). The electrodes 22 are a metal such as copper, however, other possible metals such as aluminum or tungsten can be used. The capping layer 24 is a dielectric film that is generally used to prevent oxidation and improve electro-migration. A non-exhaustive listing of materials used for the capping layer 24 may include silicon nitride, silicon carbide, or silicon carbon nitride (SiCN).

In FIG. 4, a second ILD layer 26 is deposited on the capping layer 24 and a hard mask dielectric layer 28 is deposited over the ILD layer 26. The ILD layer 26, like ILD layer 20, is a dielectric film that may include organosilicate glass (SiCOH), fluoride silicate glass (FSG) or undoped silicate glass (USG). The ILD layer 26 is deposited on the capping layer 24 using any suitable deposition technique that may include plasma enhanced chemical vapor deposition (PECVD), molecular CVD or spin-on technique. The hard mask dielectric layer 28 can be made of materials such as $SiO_2$, or $Si_3N_4$. The hard mask dielectric layer 28 is deposited on the ILD layer 26 using any suitable deposition technique that may include plasma enhanced chemical vapor deposition (PECVD), molecular CVD, or atomic layer deposition.

Figure 5:
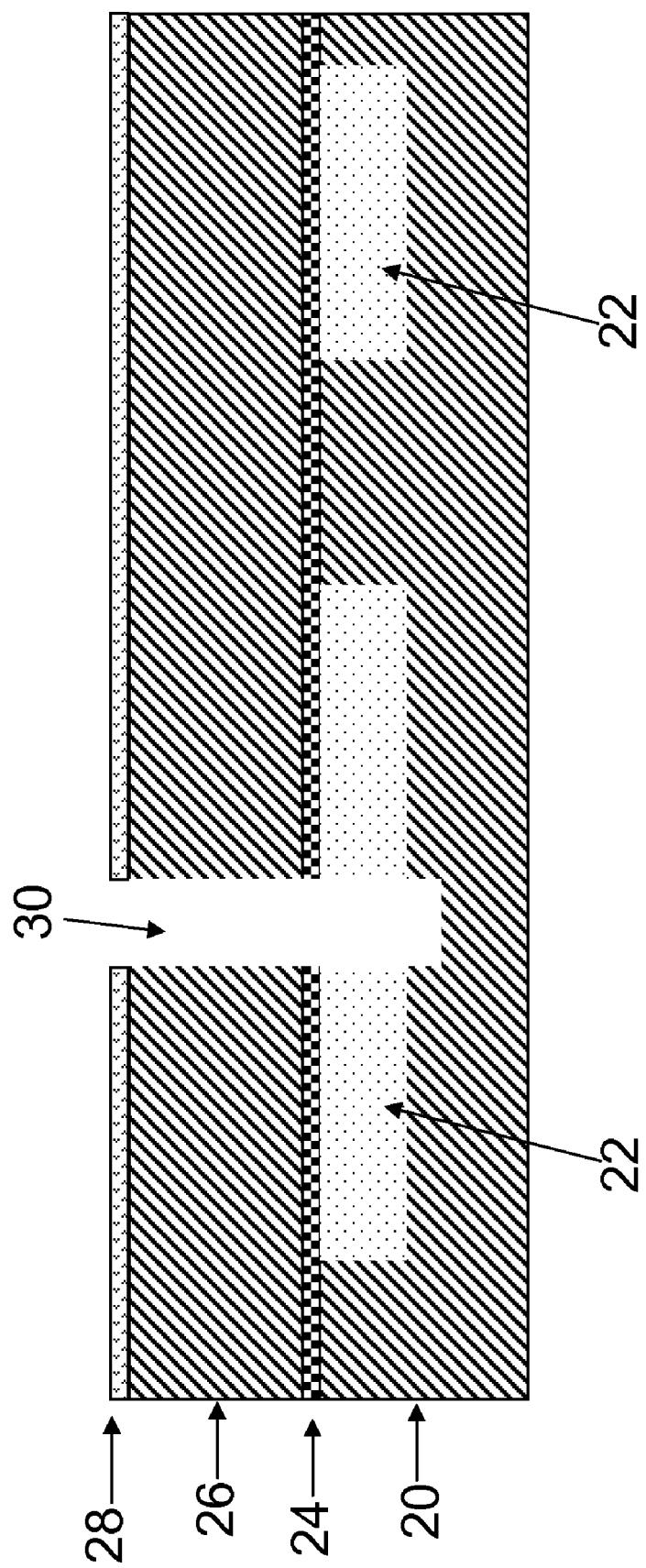

In FIG. 5, a cavity trench 30 is formed through the hard mask dielectric layer 28, the second ILD layer 26, the capping layer 24 to the first ILD layer 20, wherein the cavity trench is formed in the first ILD layer between two adjacent electrodes 22. The cavity trench 30 is formed by using a conventional back-end plasma reactive ion etching (RIE) technique to etch through the hard mask dielectric layer 28 and the second ILD layer 26, the capping layer 24 to the first ILD layer 20 between two adjacent electrodes 22.

Figure 6:
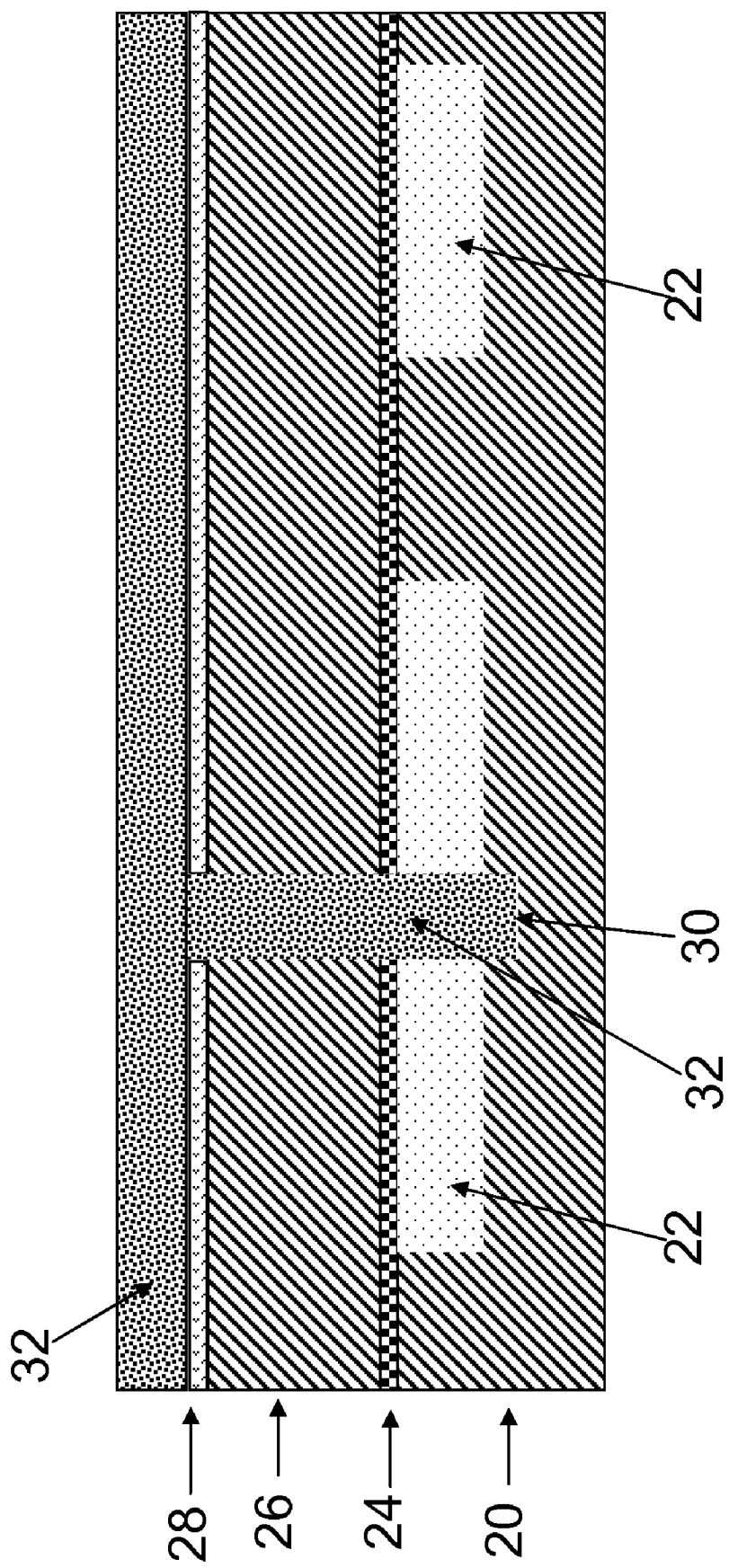

In FIG. 6, a sacrificial material 32 is deposited over the remaining hard mask dielectric layer 28 and fills the cavity trench 30. The sacrificial material 32 is preferably a carbon-based material, however, other materials such as anti-reflective coating materials that can withstand temperatures of more than 200° C. can be used. The sacrificial material 32 can be deposited by using a conventional deposition technique that may include a spin-on technique.

Figure 7:
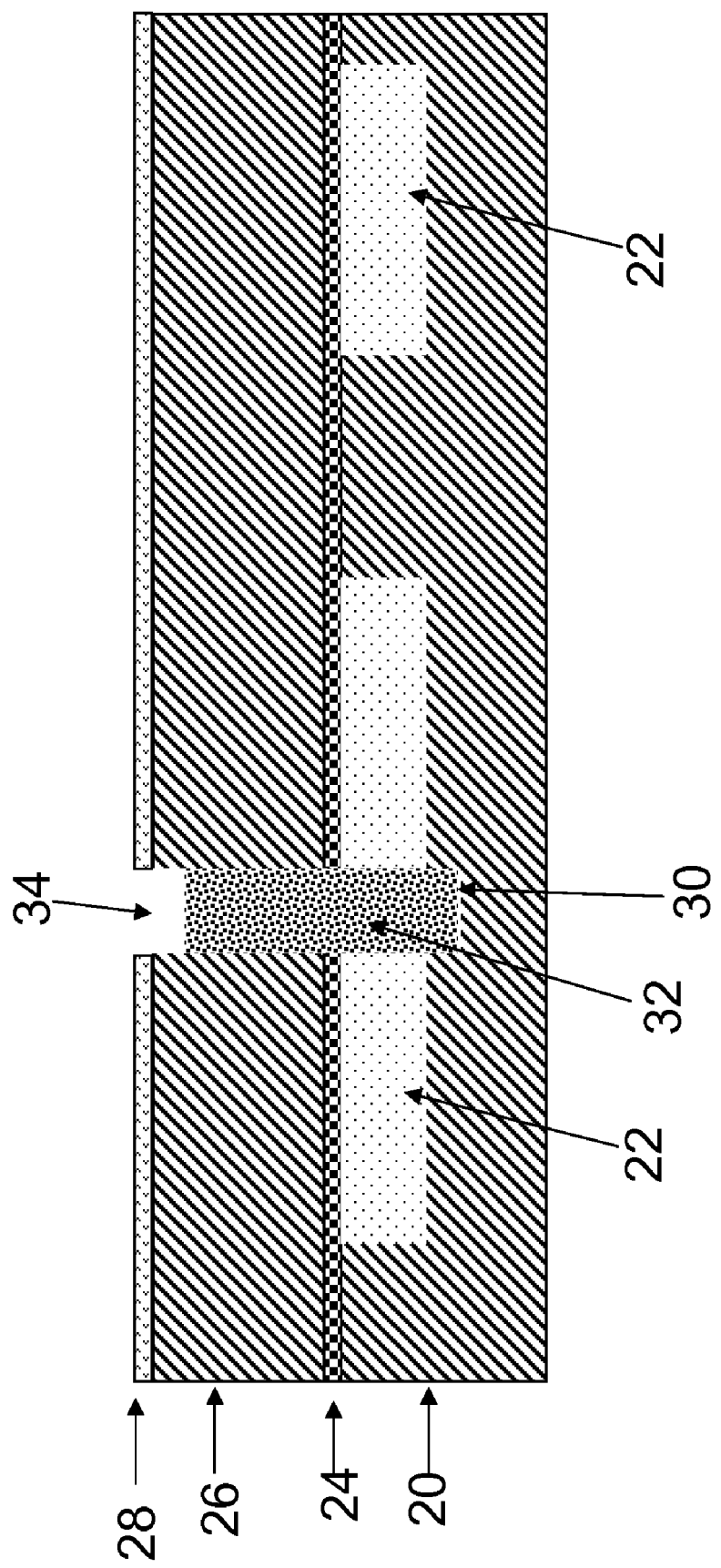

FIG. 7 shows the device after the sacrificial material 32 deposited over the remaining hard mask dielectric layer 28 has been planarized which results in a recess 34 formed in the cavity trench. A conventional planarization technique that may include an atomic oxygen plasma etch, or chemi-mechanical polish (CMP) is used to planarize the sacrificial material 32. Because it is desirable to ensure that no sacrificial material remains over the hard mask dielectric layer 28, slight over-etching occurs, resulting in the recess 34 about the cavity trench 30.

Figure 8:
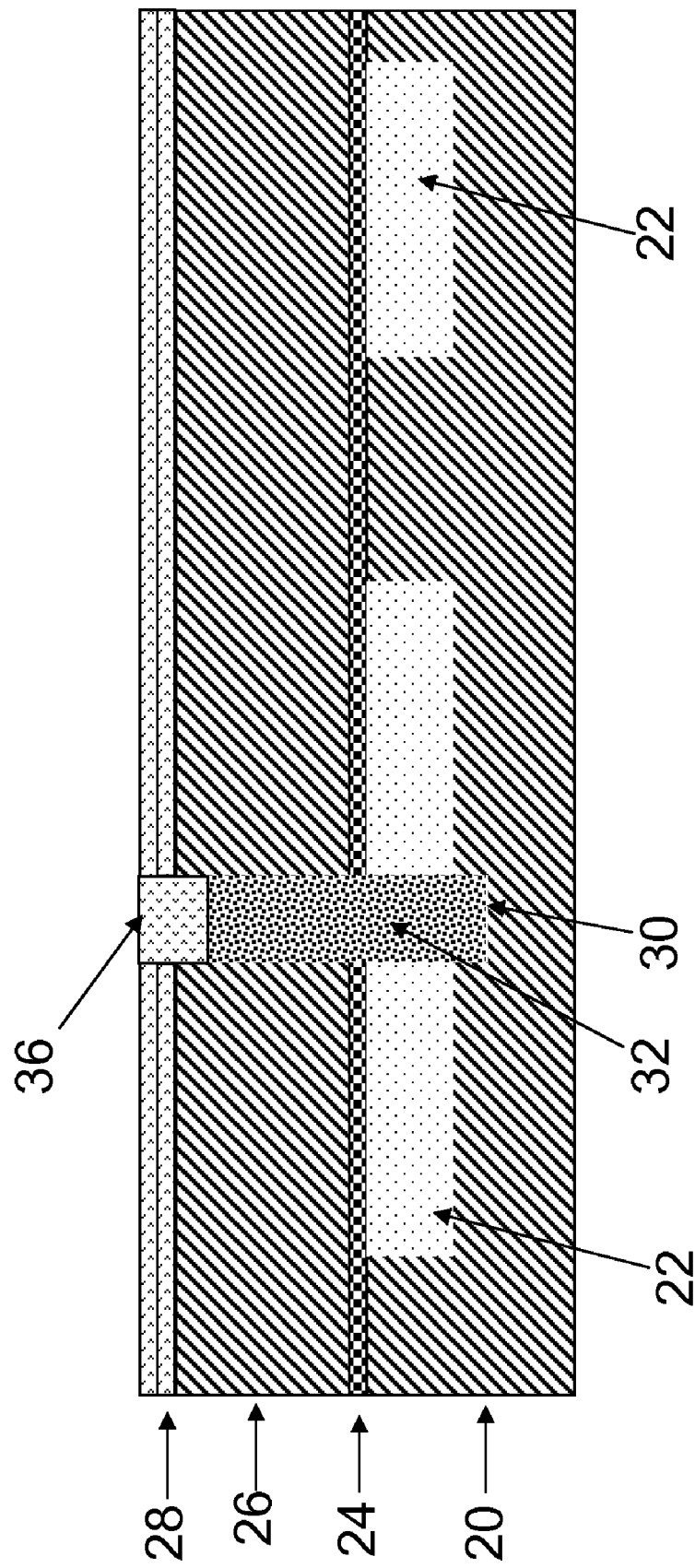

In FIG. 8, a second hard mask dielectric layer 36 is deposited over the first hard mask dielectric layer 28 which results in the recess 34 being filled. Like the first hard dielectric mask layer 28, the second hard mask dielectric layer 36 is made of materials such as $SiO_2$, or $Si_3N_4$ that can be deposited by a deposition technique that may include plasma enhanced chemical vapor deposition (PECVD), molecular CVD, or atomic layer deposition.

Figure 9:
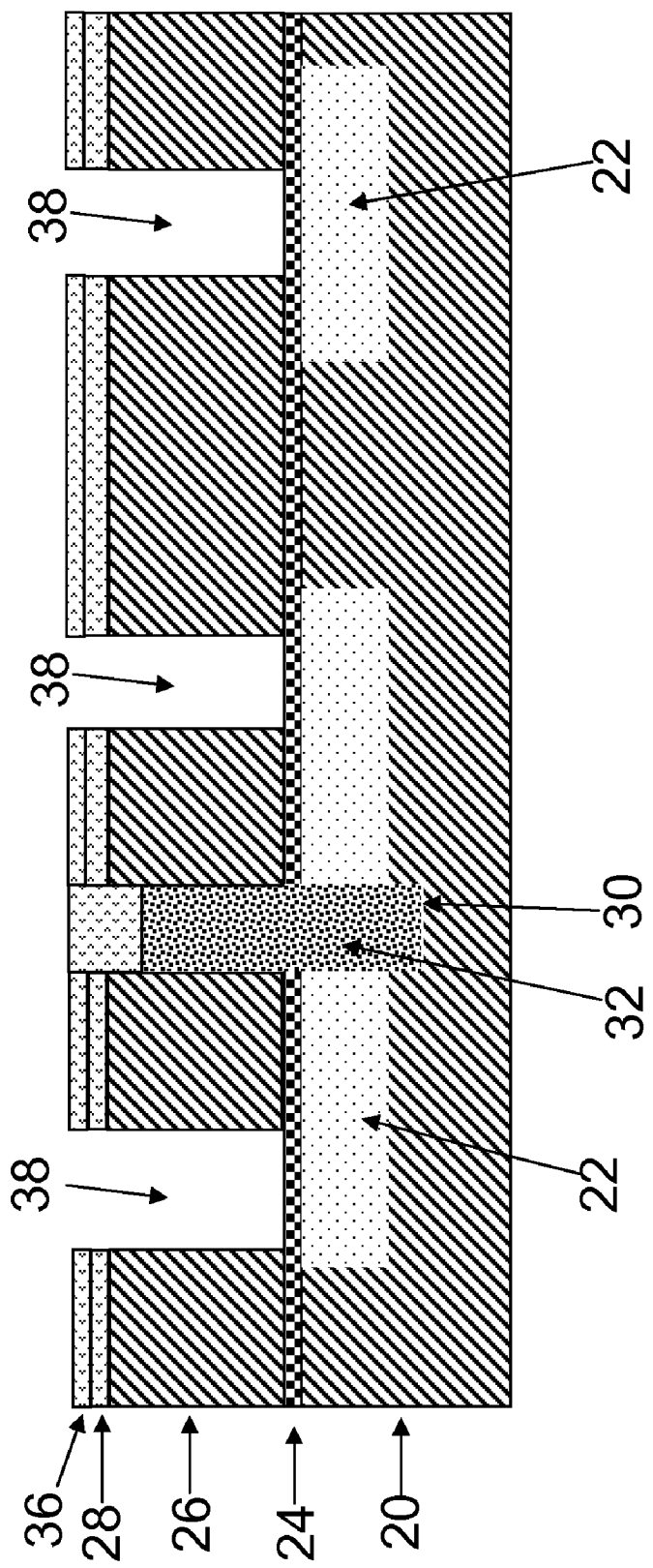

In FIG. 9, at least one via 38 is formed through portions of the masks 28 and 36, through the second ILD layer 26 to a top surface of the capping layer 24. The vias 38 are formed by using conventional lithography and etching techniques.

Figure 10:
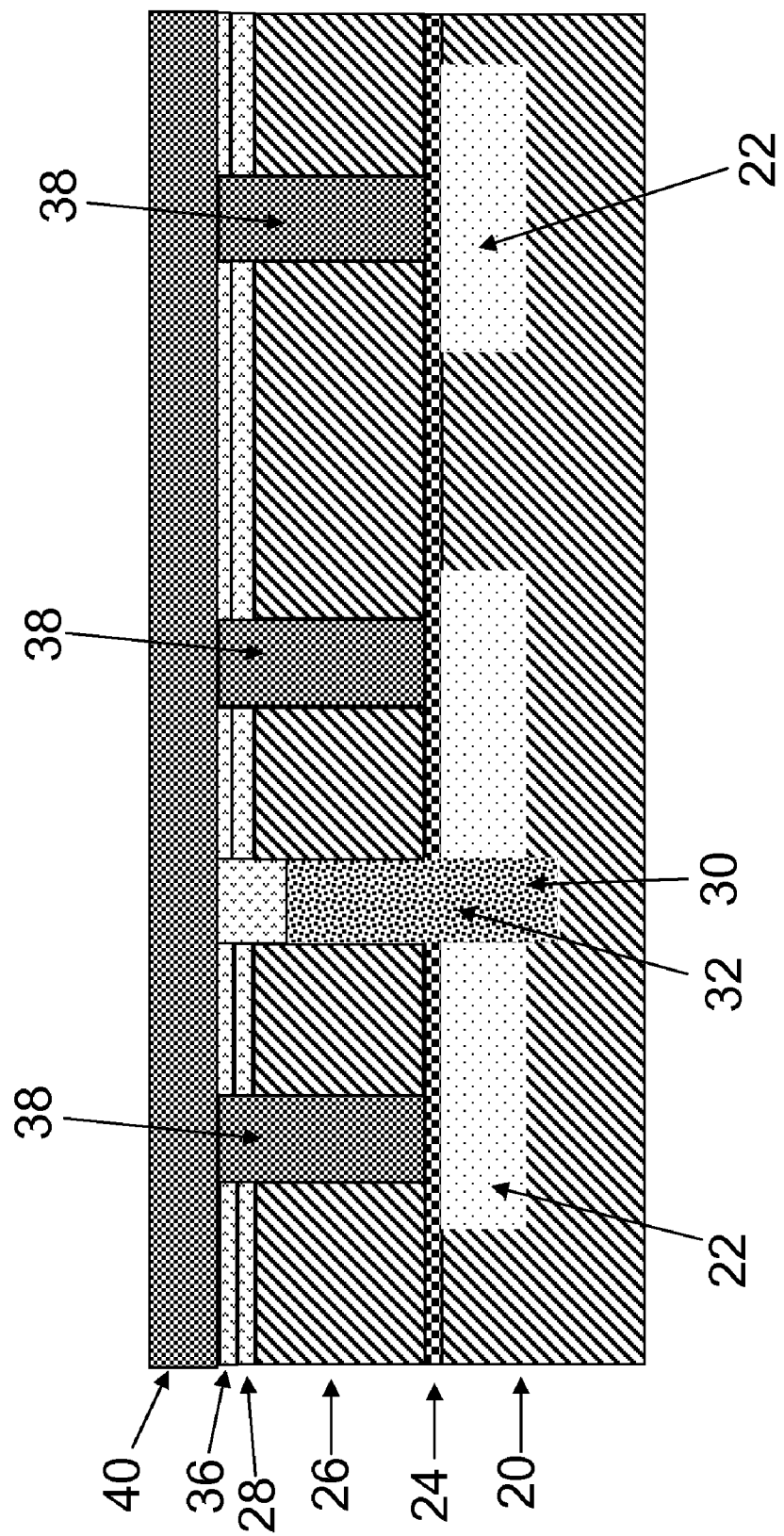

In FIG. 10, an anti-reflective coating (ARC) layer 40 is deposited over the hard mask dielectric layer 36 which results in the vias 38 being filled with the ARC material. Any suitable ARC material such as NFC (near frictionless carbon) film can be used as the ARC layer 40. The ARC layer 40 can be deposited by using a conventional deposition technique that may include a spin-on technique.

Figure 11:
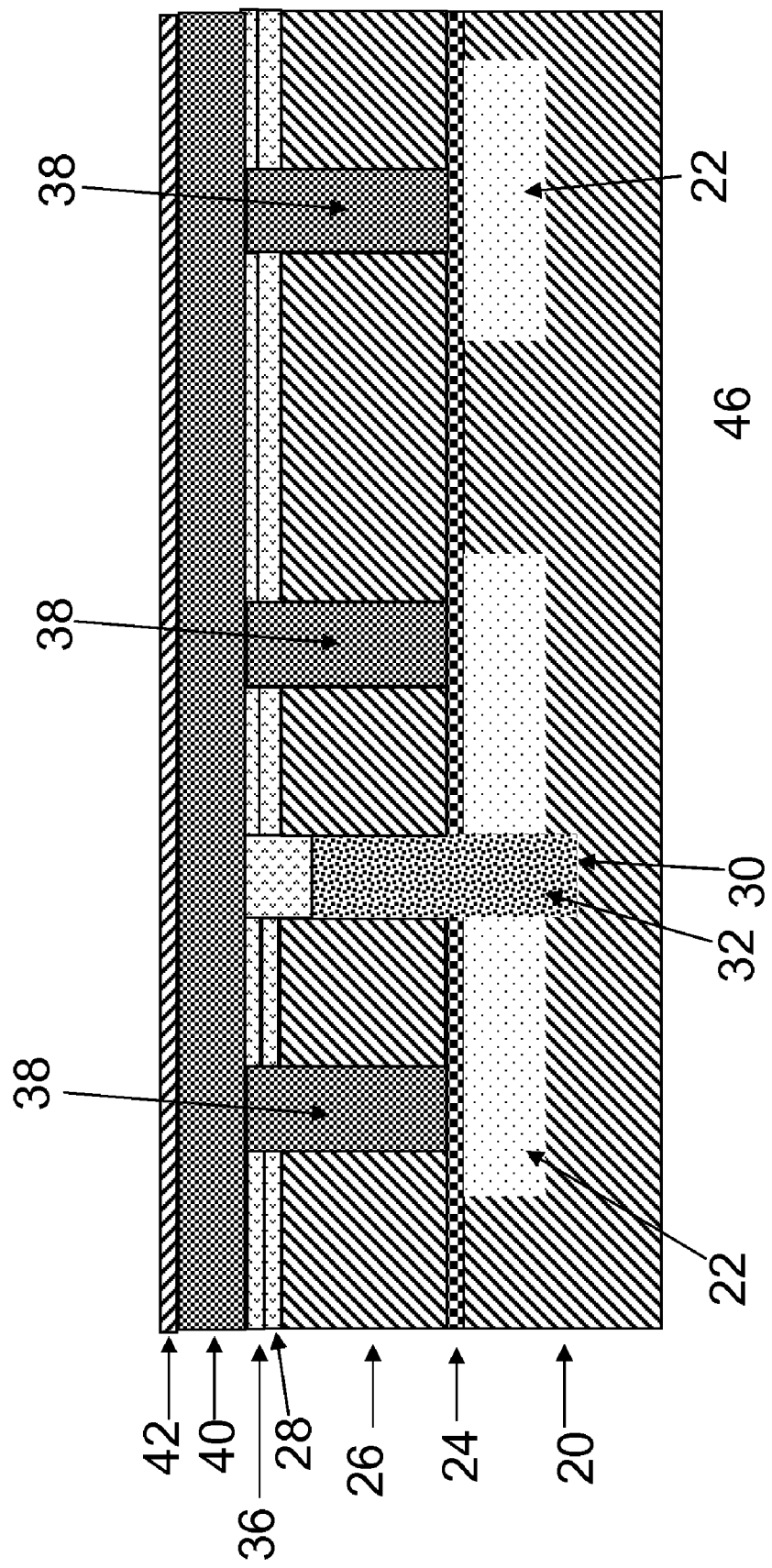

In FIG. 11, a dielectric layer 42 is deposited over the ARC layer 40. In one embodiment, the dielectric layer 42 is any low temperature dielectric that may include a low temperature oxide or nitride. The dielectric layer 42 can be deposited by using a conventional deposition technique such as plasma enhanced chemical vapor deposition (PECVD).

Figure 12:
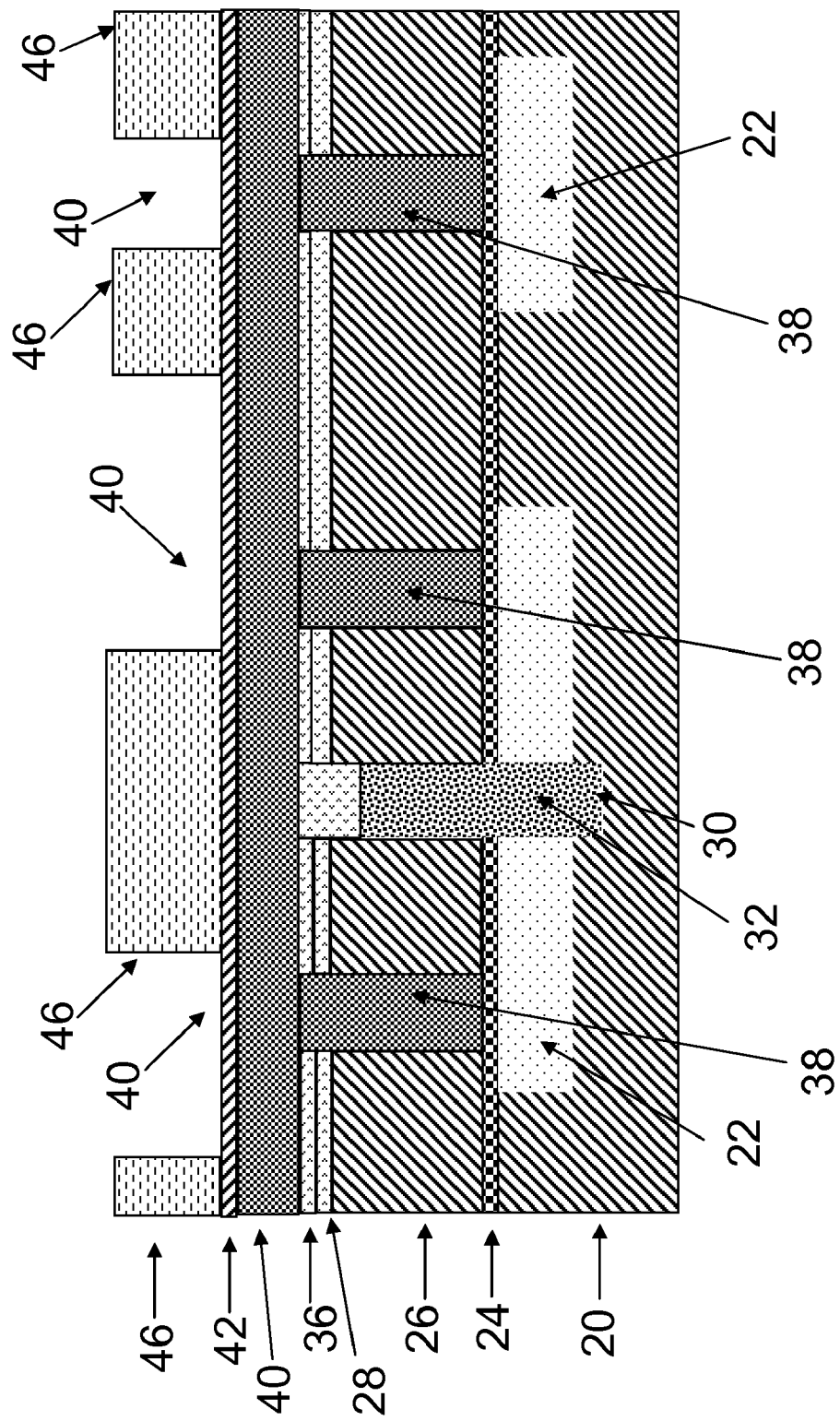
Figure 13:
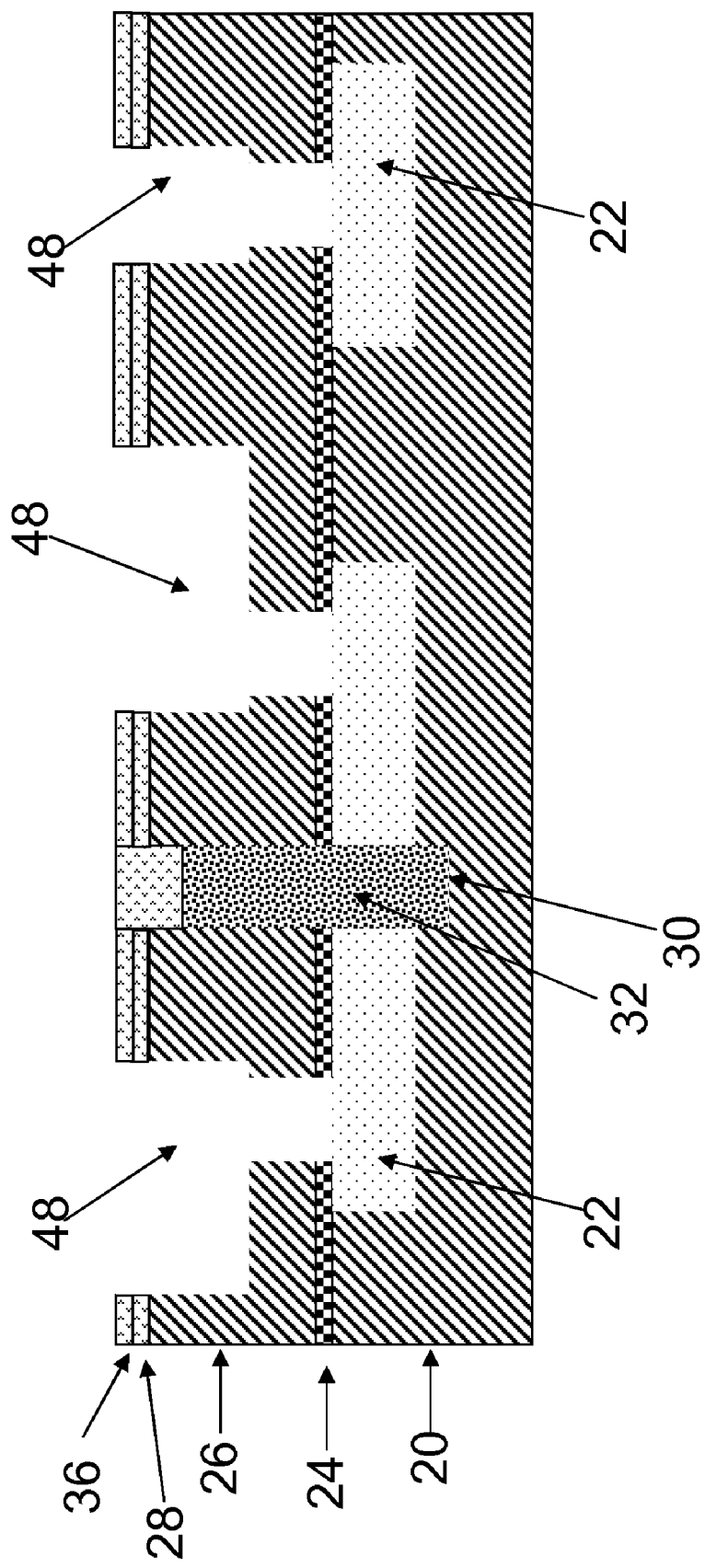
Figure 14:
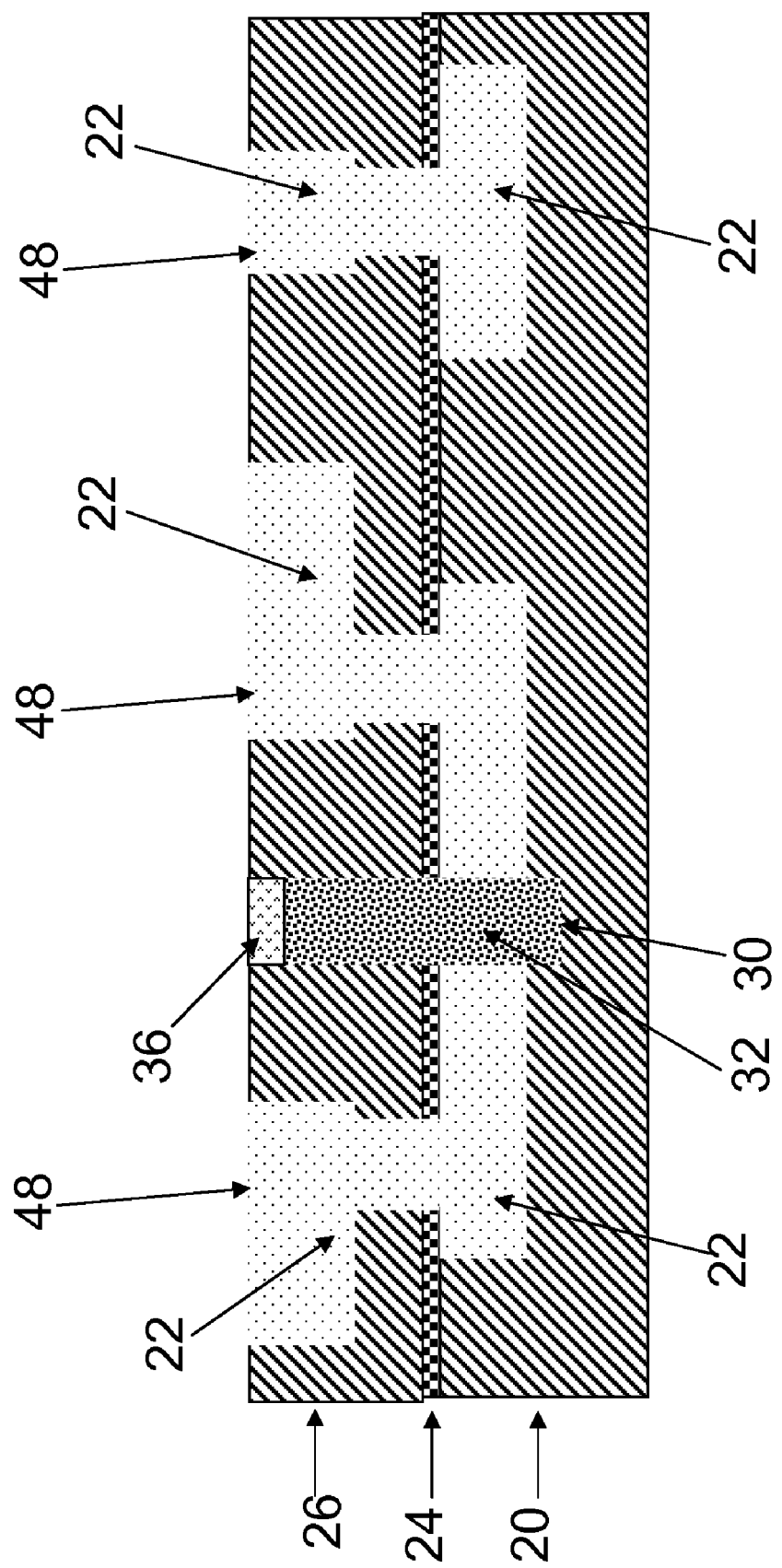

In FIGS. 12-14, a metal trench is formed around each of the vias. The metal trench is formed by applying a photoresist layer over the dielectric layer 42. The photoresist layer is exposed and developed forming patterns 46 through a conventional lithographic technique. As shown in FIG. 12, the lithography stops at the top surface of the dielectric layer 42. In FIG. 13, a trench 48 is formed about where the metal wire patterning was performed. In particular, a conventional etching technique is used to etch through the dielectric layer 42, the ARC layer 40, the hard mask dielectric layers 36 and 28, vias 38 filled with the ARC material and the capping layer 24 to the electrodes 22 in the first ILD layer 20. The resulting trenches are typical dual damascene trenches. The cavity trench 30 filled with the sacrificial material 32 remains as does the portion of the second hard mask dielectric layer 36 that filled the recess in that via. In FIG. 14, the trench 48 is filled with a metal 22 such as copper, however, other possible metals such as dual-damascene copper, tungsten or aluminum may be used. The metal deposited in the trench is deposited by using a conventional deposition technique that may include physical vapor deposition (PVD) or chemical vapor deposition (CVD).

Figure 15:
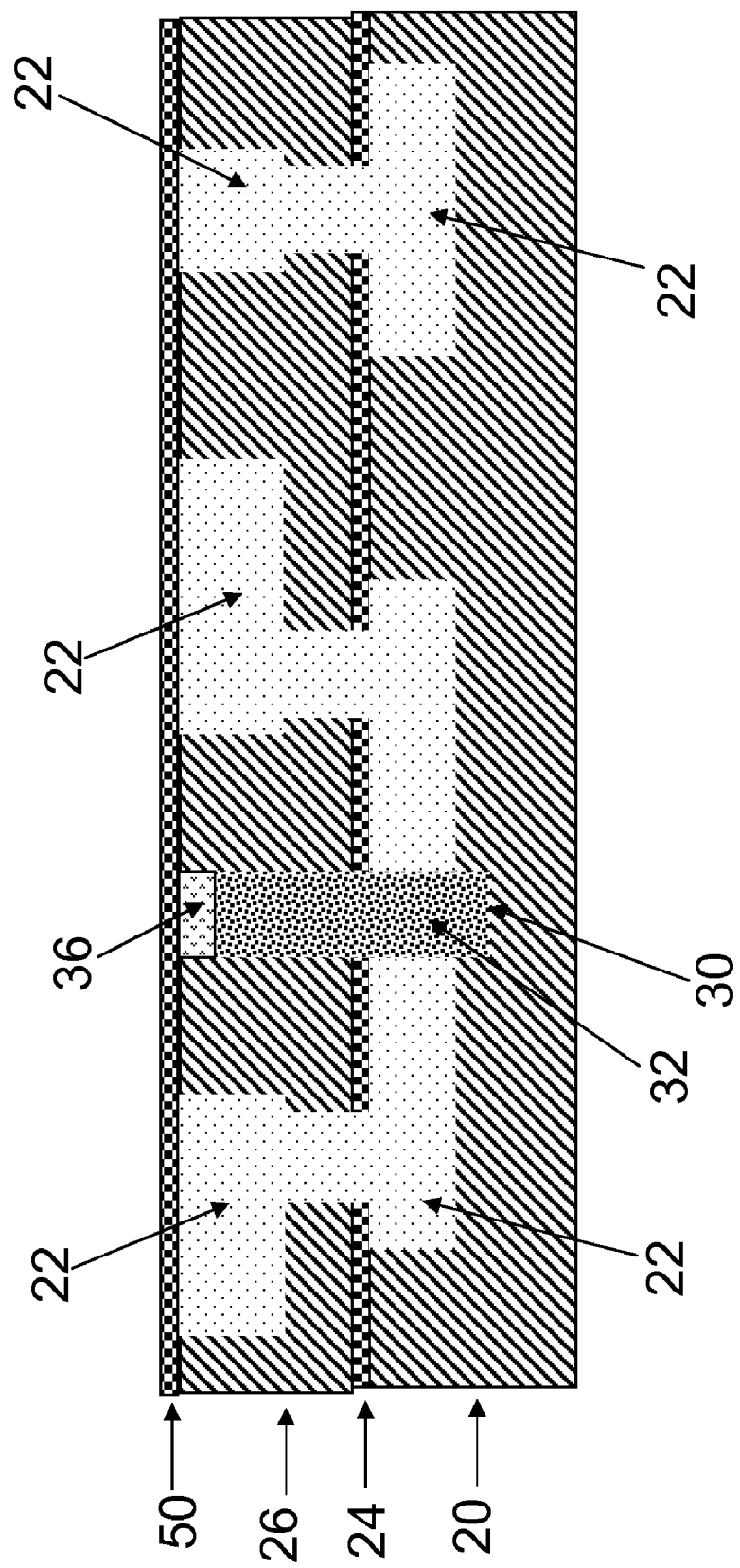

After filling the trench 48, the metal is polished and then a capping layer 50 is deposited as shown in FIG. 15. The capping layer 50 is deposited over the metal filled trenches as well as portions of the second ILD layer 26, and the second mask 36. The capping layer 50 is any type of dielectric film that can prevent oxidation and improve electro-migration. A non-exhaustive listing of materials used for the capping layer 50 may include silicon nitride, silicon carbide, or silicon carbon nitride (SiCN).

Figure 16:
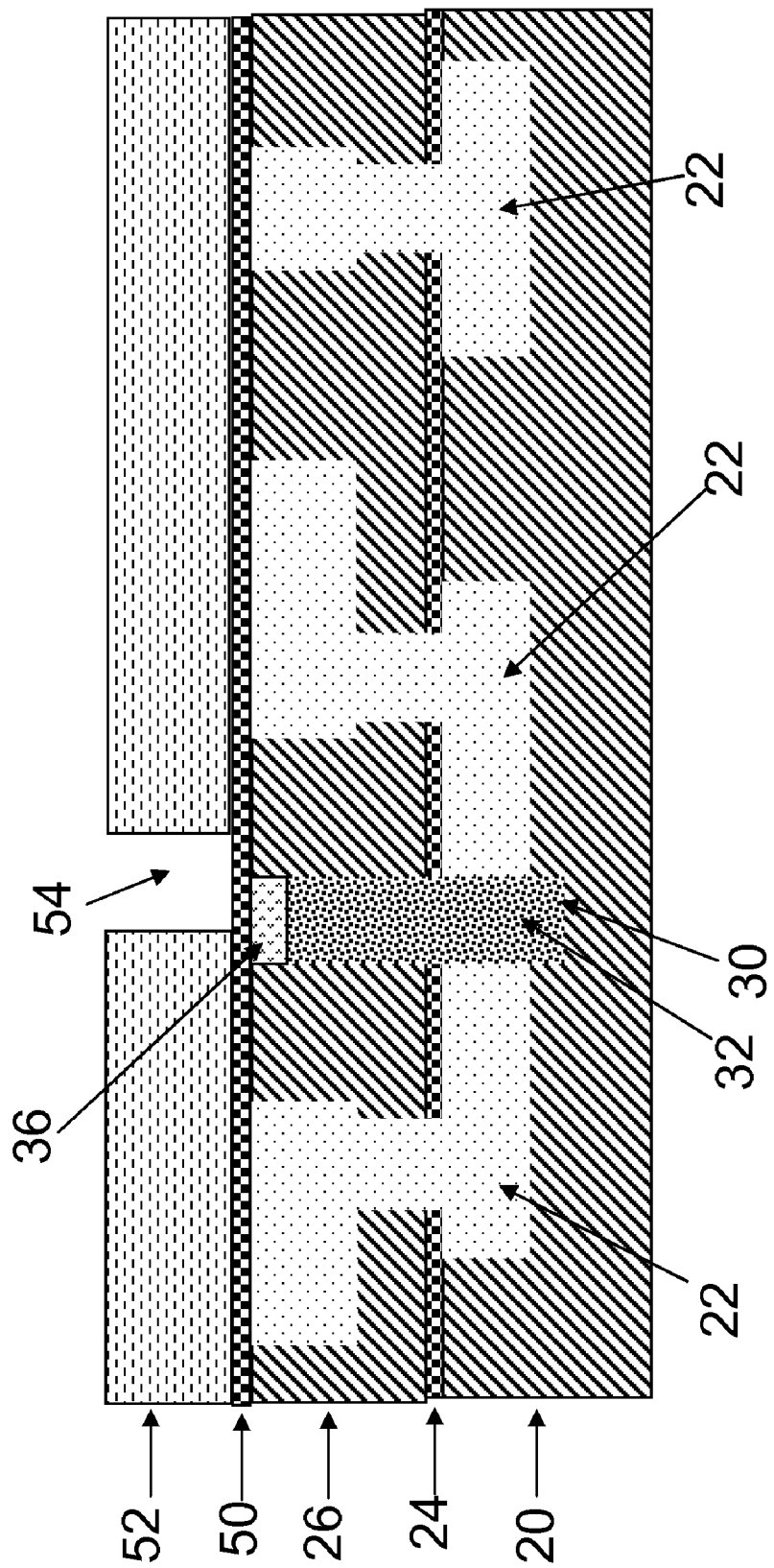
Figure 17:
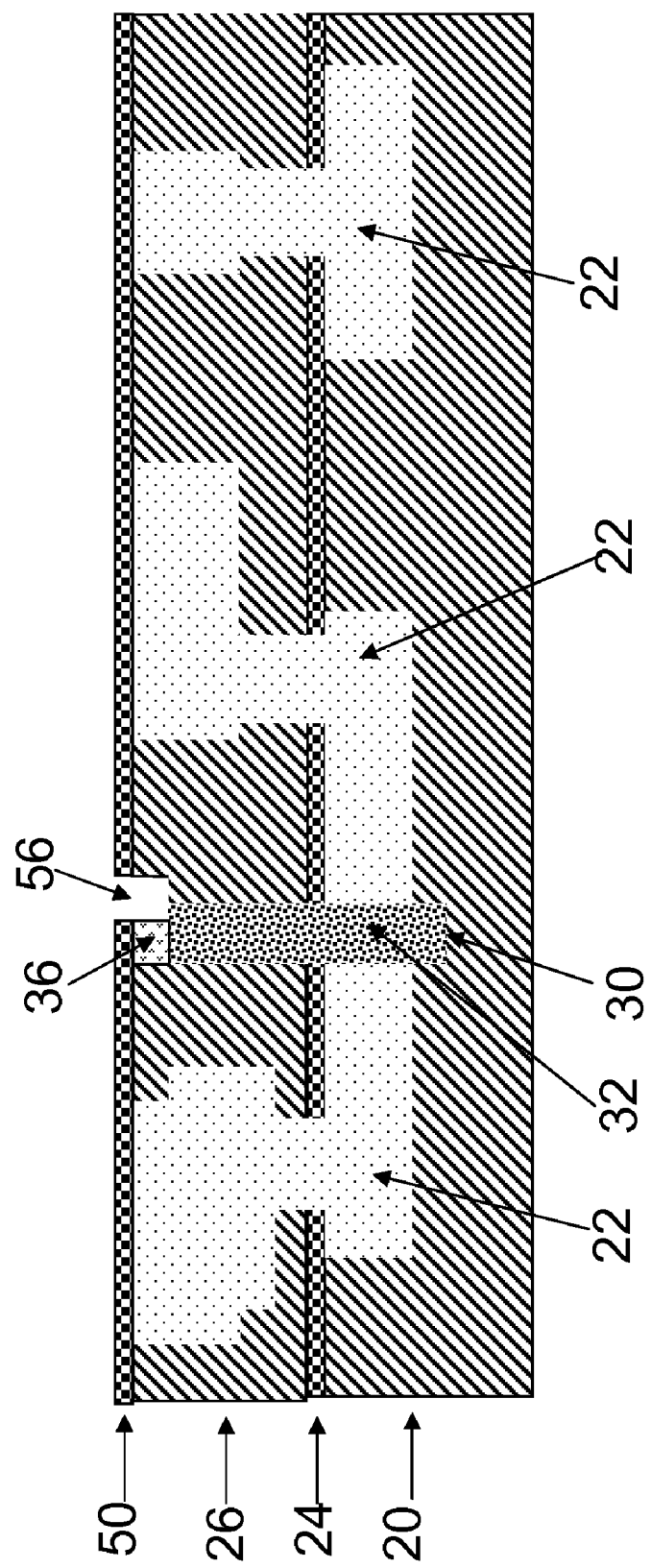

In FIGS. 16-17, a cavity release opening is formed over the top of the cavity trench 30. In particular, FIG. 16 shows that a photoresist layer 52 has been deposited over the capping layer 50 and an opening 54 is formed through a portion of the photoresist layer 52. The opening 54 is slightly off-center from the cavity trench 30. In FIG. 17, a conventional etching technique that may include a plasma RIE dry etch is used to etch an opening 56 through the capping layer 50 and a corner of the hard mask dielectric film 36 as well as a portion of the second ILD layer 26.

Figure 18:
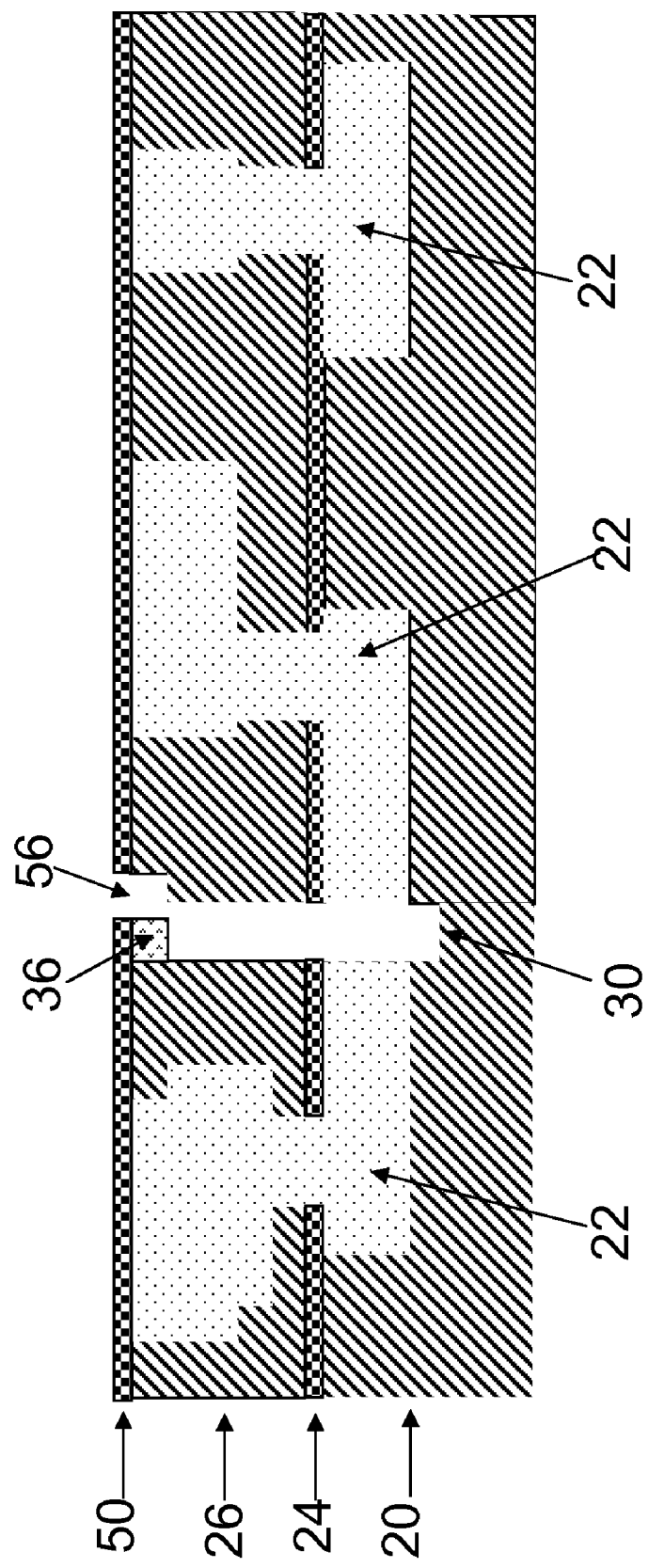
Figure 19:
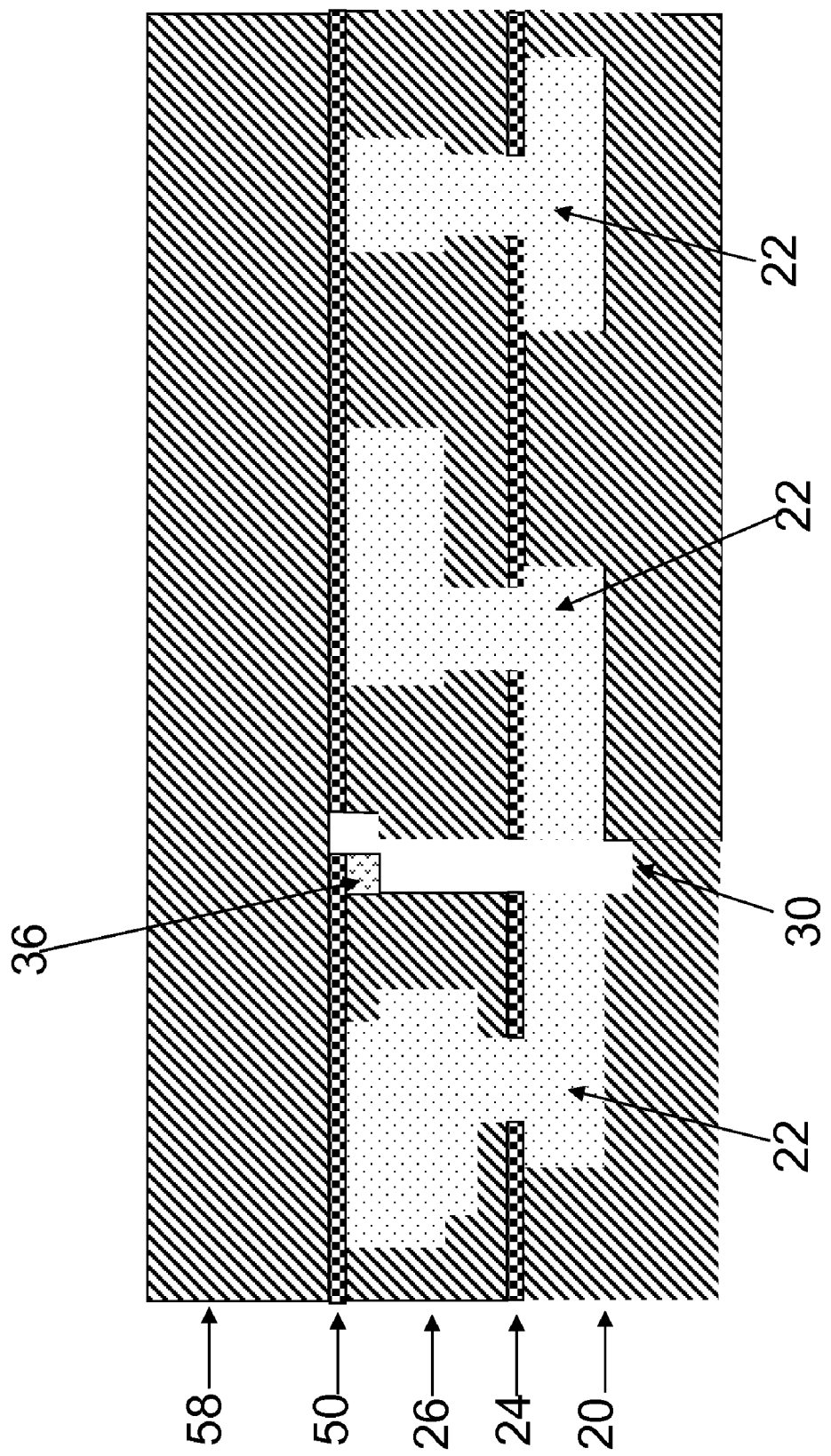

FIGS. 18-19 show the formation of the gap in the cavity trench 30 by extending the opening 56 therethrough. In particular, FIG. 18 shows that the remaining sacrificial material 32 in the cavity trench 30 has been removed. The remaining sacrificial material 32 is removed by a conventional etching technique that may include dry etching, or wet etch. FIG. 18 shows that after the etching has been performed a remaining portion of the hard mask dielectric film 36 is retained at a top portion in the cavity 30. In FIG. 19, a third ILD layer 58 is deposited over the capping layer 50 and the opening 56. The ILD layer 58 is a dielectric film that may include organosilicate glass (SiCOH), fluoride silicate glass (FSG) or undoped silicate glass (USG). The ILD layer 56 is deposited on the capping layer 50 using any suitable deposition technique that may include plasma enhanced chemical vapor deposition (PECVD), molecular CVD, or physical vapor deposition. The ILD layer 58 hermetically seals the cavity release opening 56 to provide the ESD protection. In one embodiment, the gap sealed in the cavity trench 30 may be air-filled or vacuum-filled. After forming the ESD device, it is integrated with an integrated circuit by coupling it to the pad of the circuit to provide the ESD protection against ESD events.

The foregoing process described in FIGS. 3-19 shows some of the processing functions associated with fabricating the ESD device. In this regard, each figure represents a process act associated with forming the ESD device. It should also be noted that in some alternative implementations, the acts noted in the figures may occur out of the order noted in the figures or, for example, may in fact be executed in different order, depending upon the acts involved. Also, one of ordinary skill in the art will recognize that additional figures that describe the formation of the ESD device may be added.

The integrated circuit chips that are integrated with the ESD device described herein can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It is apparent that there has been provided by this disclosure a method for forming an on-chip high frequency electro-static discharge device. While the disclosure has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the disclosure.

What is claimed is:

1. A method for forming an electro-static discharge protection device on an integrated circuit, comprising:
   providing a capped first dielectric layer with more than one electrode formed therein;
   depositing a second dielectric layer over the capped first dielectric layer;
   depositing a first hard mask dielectric layer over the second dielectric layer;
   forming a cavity trench through the first hard mask dielectric layer and the second dielectric layer to the capped first dielectric layer, wherein the cavity trench is formed in the capped first dielectric layer between two adjacent electrodes;
   forming at least one via through the second dielectric layer about the cavity trench;
   forming a metal trench around each of the at least one via;
   forming a release opening over the cavity trench; and
   depositing a third dielectric layer over the second dielectric layer, wherein the third dielectric layer hermetically seals the release opening to provide electro-static discharge protection.

2. The method according to claim 1, further comprising filling the cavity trench with a sacrificial material.

3. The method according to claim 2, wherein the filling of the cavity trench with the sacrificial material comprises depositing the sacrificial material over the second dielectric layer.

4. The method according to claim 3, further comprising planarizing the sacrificial material deposited over the second dielectric layer.

5. The method according to claim 4, further comprising removing a portion of the sacrificial material from the cavity trench to form a recess therein.

6. The method according to claim 2, further comprising removing the sacrificial material from the cavity trench through the release opening.

7. The method according to claim 1, further comprising depositing a second hard mask dielectric layer over the first hard mask dielectric layer prior to forming the at least one via.

8. The method according to claim 7, wherein the first hard mask dielectric layer and the second hard mask dielectric layer comprise $SiO_2$.

9. The method according to claim 1, further comprising depositing an anti-reflective coating layer prior to the forming of a metal trench around each of the at least one via.

10. The method according to claim 9, further comprising depositing a low temperature dielectric layer over the anti-reflective coating layer.

11. The method according to claim 1, wherein the forming of a metal trench around each of the at least one via comprises applying a first photoresist layer over the second dielectric layer.

12. The method according to claim 11, further comprising etching through portions of the first photoresist layer.

13. The method according to claim 12, further comprising filling the etched portions with a metal material.

14. The method according to claim 13, wherein the metal material comprises a copper, tungsten or aluminum.

15. The method according to claim 1, further comprising depositing a cap layer over the second dielectric layer, each metal trench and the cavity trench.

16. The method according to claim 1, wherein the forming of the release opening comprises depositing a second photoresist layer over the second dielectric layer, each metal trench and the cavity trench.

17. The method according to claim 16, wherein the forming of the release opening comprises using a plasma RIE dry etch to etch an opening through a portion of the second dielectric layer.

18. The method according to claim 1, wherein the hermetically sealed release opening is vacuum-filled or air-filled.

19. The method according to claim 1, further comprising integrating the electro-static discharge protection device on the integrated circuit.

20. A method for forming an electro-static discharge protection device on an integrated circuit, comprising:

providing a capped first dielectric layer with more than one electrode formed therein;

depositing a second dielectric layer over the capped first dielectric layer;

depositing a first hard mask dielectric layer over the second dielectric layer;

forming a cavity trench through the first hard mask dielectric layer and the second dielectric layer to the capped first dielectric layer, wherein the cavity trench is formed in the capped first dielectric layer between two adjacent electrodes;

filling the cavity trench with a sacrificial material;

forming at least one via through the second dielectric layer about the cavity trench;

forming a metal trench around each of the at least one via;

forming a release opening over the cavity trench;

removing the sacrificial film inside the cavity trench; and depositing a third dielectric layer over the second dielectric layer, wherein the third dielectric layer hermetically seals the release opening to provide electro-static discharge protection.

* * * * *